United States Patent [19]

Kuesters et al.

[11] Patent Number: 5,025,295
[45] Date of Patent: Jun. 18, 1991

[54] THREE-DIMENSIONAL ONE-DIMENSIONAL CELL ARRANGEMENT FOR DYNAMIC SEMICONDUCTOR MEMORIES AND METHOD FOR THE MANUFACTURE OF A BIT LINE CONTACT

[75] Inventors: Karl-Heinz Kuesters, Munich; Wolfgang Mueller, Putzbrunn; Gerd Enders, Munich, all of Fed. Rep. of Germany

[73] Assignee: Siemens Aktiengesellschaft, Munich, Fed. Rep. of Germany

[21] Appl. No.: 464,685

[22] Filed: Jan. 16, 1990

Related U.S. Application Data

[63] Continuation of Ser. No. 312,303, Feb. 17, 1989, abandoned, which is a continuation of Ser. No. 64,613, Jun. 22, 1987, abandoned.

[30] Foreign Application Priority Data

Mar. 6, 1987 [DE] Fed. Rep. of Germany ....... 3707241

[51] Int. Cl.[5] .................... H01L 29/68; H01L 29/34; H01L 29/06
[52] U.S. Cl. .................... 357/23.6; 357/54; 357/55; 357/59
[58] Field of Search .................... 357/23.6, 54, 55, 65, 357/710, 59 I, 41, 195, 235, 913, 920, 978, 979

[56] References Cited

U.S. PATENT DOCUMENTS

| | | | |
|---|---|---|---|
| 4,649,625 | 3/1987 | Lu | 357/23.6 |
| 4,658,283 | 4/1987 | Koyama | 357/23.6 |
| 4,668,973 | 5/1987 | Dawson | 357/54 |
| 4,710,897 | 12/1987 | Masuoka | 357/59 I |
| 4,803,535 | 2/1989 | Taguchi | 357/23.6 |
| 4,894,696 | 1/1990 | Takeda et al. | 357/55 |

FOREIGN PATENT DOCUMENTS

0108390 5/1984 European Pat. Off. .
0191612 8/1986 European Pat. Off. ........... 357/23.6

OTHER PUBLICATIONS

1987 Symposium on VLSI Technology, Digest of Technical Papers, pp. 93 and 94, May 1987, Kuesters et al.

"Cell Structures for Future Dram's", Technical Digest IEDM, 1985, pp. 694 to 697, by Sunami.

"Buried Storage Electrode (BSE) Cell for Megabit Drams", Technical Digest, IEDM, 1985, pp. 710 to 713, by Sakamoto et al.

*Primary Examiner*—Mark Prenty
*Attorney, Agent, or Firm*—Hill, Van Santen, Steadman & Simpson

[57] ABSTRACT

A three-dimensional, one transistor cell arrangement for dynamic semiconductor memories utilizing a trench capacitor in the substrate, and provided with a switching field effect transistor including an insulated gate electrode connected to the source/drain zone, the bit line contact for the connection of the switching transistor being arranged to be self-adjusted on the drain region in the semiconductor substrate, and overlapping the gate electrode with insulating layers on all sides. It also overlaps the neighboring field oxide region. The insulation layer laying beneath the bit line and over the gate level is a triple layer composed of silicon oxide/silicon nitride/silicon oxide, and in the through hole etching which is carried out by specific etching steps, there exists a self-adjusted overlapping contact. By eliminating the imprecision caused by the lithography, the space requirement of a memory cell can be reduced by about 20%. The invention is particularly utilized in the manufacture of 4 megabit DRAMs.

10 Claims, 4 Drawing Sheets

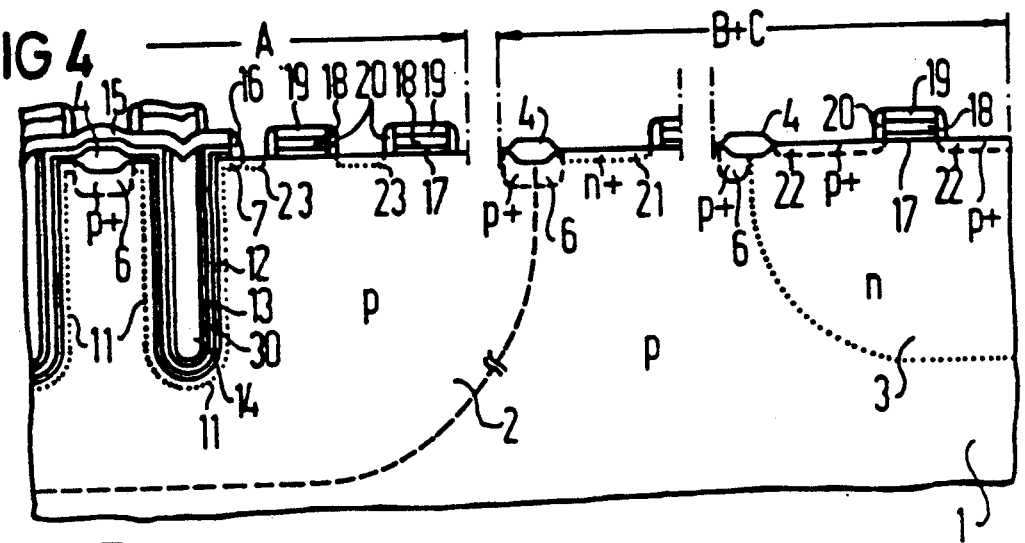
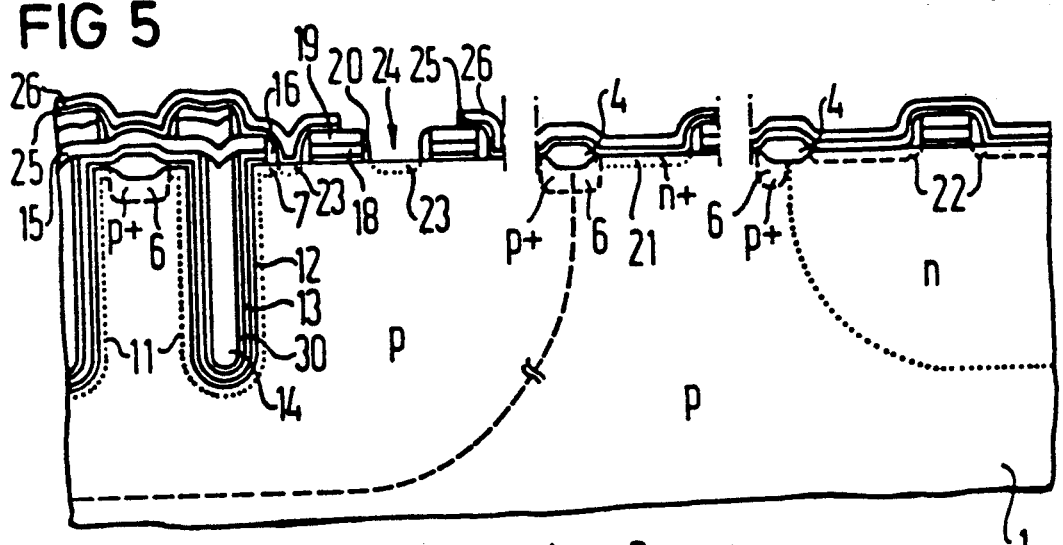
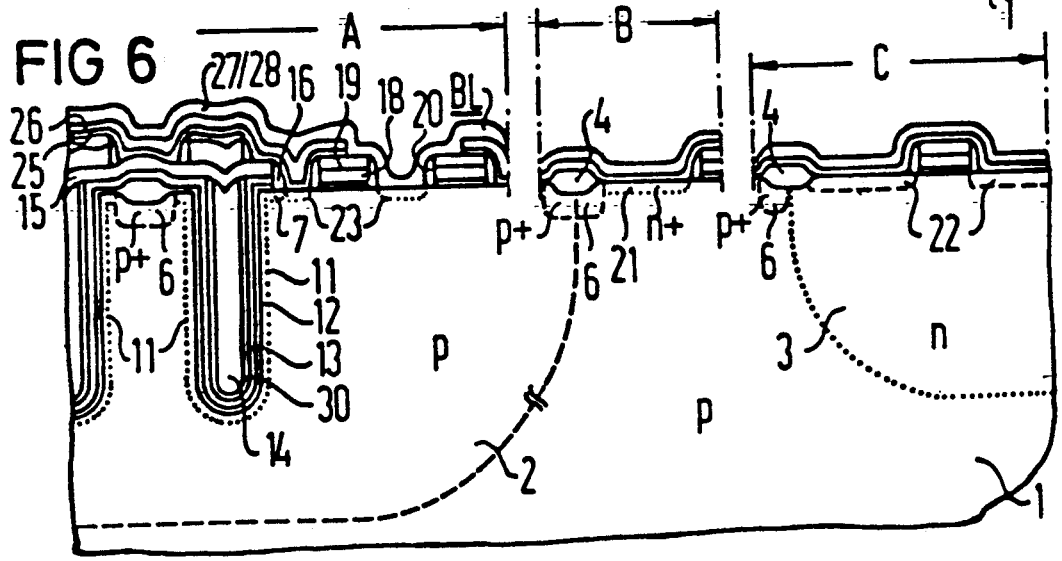

FIG 11
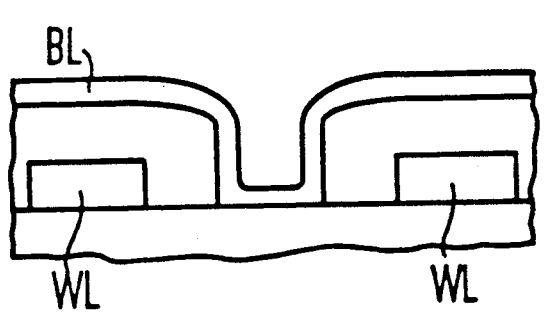
FIG 12
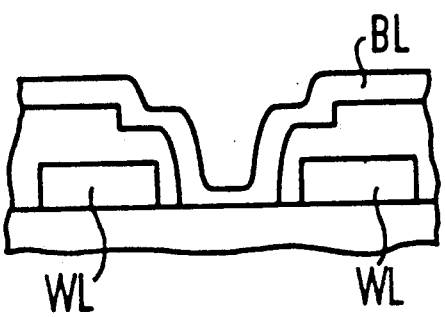
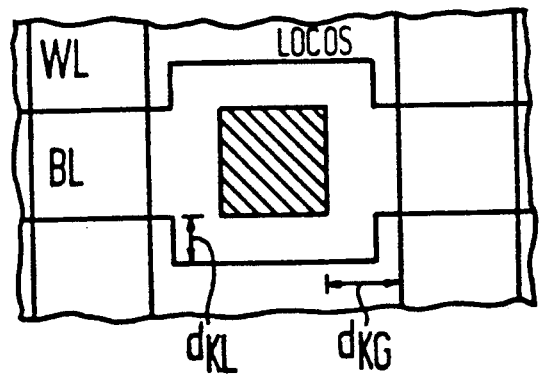
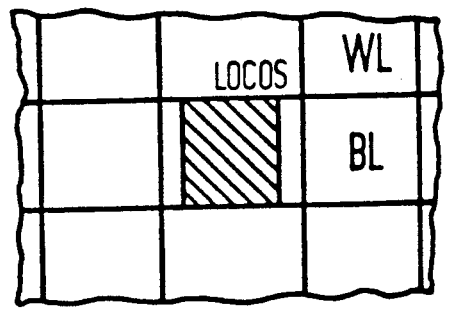

THREE-DIMENSIONAL ONE-DIMENSIONAL CELL ARRANGEMENT FOR DYNAMIC SEMICONDUCTOR MEMORIES AND METHOD FOR THE MANUFACTURE OF A BIT LINE CONTACT

This is a continuation of application Ser. No. 312,303, filed Feb. 17, 1989, now abandoned, which is a continuation of application Ser. No. 064,613, filed June 22, 1987, now abandoned.

BACKGROUND OF THE INVENTION

1. Field of the Invention

The present invention is directed to three-dimensional, one transistor cell arrangements for dynamic semiconductor memories wherein the capacitor for storing charges is in the form of a trench capacitor in the substrate and is located under a field effect switching transistor having an insulated gate electrode lying at the surface of the common substrate, and electrically connected to the source/drain zones thereof. The source/drain zones of the field effect transistor are externally connected to a bit line which is provided with an insulating layer and is positioned above the level containing the gate electrodes.

2. Description of the Prior Art

An arrangement describing a three-dimensional cell using a trench capacitor is found in the report by H. Sunami entitled: "Cell Structures for Future DRAMs", in the Technical Digest, IEDM, 1985, pages 694 to 697, particularly FIG. 3. Other 1-transistor cell trench capacitor arrangements will be found from the disclosure in European patent application 0,108,390 of Hitachi.

What these arrangements have in common is that, in order to increase the packing density in dynamic random access memories (DRAMs) the capacitor is in the form of a trench cell for reasons of lower available cell areas and because of values of capacitance from 30 to 50 fF are required for freedom from trouble. By using a third dimension in the trench cell, there is a possibility of realizing a cell capacitance of 40 fF with a minimum space requirement. The trench depth is frequently on the order of 10 microns, but this is difficult to produce because of manufacturing difficulties.

SUMMARY OF THE INVENTION

The present invention employs a three-dimensional integration of the component parts, whereby there is provided a 1 transistor cell arrangement comprising a manageable trench depth for dynamic semiconductor memories where, in addition to an optimization of the electrical parameters with respect to, among other things, a lower dependence on manufacturing tolerances as well as a minimization of degradation effects in long term operation, a further reduction of the memory cell area is possible.

The method of the present invention provides a transistor cell arrangement on the basis of uncomplicated procedural steps.

To achieve the stated objectives, a three-dimensional, one transistor cell arrangement of the type initially described has the following characteristics:

(a.) The bit line contact for the connection of the switching transistor is made self-adjusted on the drain region lying in the semiconductor substrate and overlaps the gate electrode covered on all sides with insulating layers and also overlaps the neighboring field oxide region provided for the lateral insulation of the individual elements of the circuit;

(b.) The insulating layer lying beneath the bit line and over the gate level is composed of at least one double layer of silicon oxide and silicon nitride, and the layer adjacent to the bit line is a silicon oxide layer.

It is within the scope of the present invention to provide an insulating layer lying under the bit line which is a triple layer of silicon oxide/silicon nitride/silicon oxide, the silicon nitride layer being significantly thinner than the layer thickness of the silicon oxide layer lying there above, but amounting to at least 10 nm. The gate electrode is composed of polysilicon and is encapsulated by a silicon oxide layer on all sides, the layer thickness at the side walls being on the order of 200 nm.

In a specific embodiment of the invention, the trench capacitor depth amounts to about 4 microns and the cross-sectional area is about 0.8 to 1 square micron. The bit line is composed of a double layer preferably consisting of arsenic-doped or phosphorus-doped polycrystalline silicon and tantalum silicide or molybdenum silicide.

Because of the self-adjusted formation of the contact of the bit line for connection to the switching transistor, the elimination of the positional lack of precision caused by the lithography results in a reduction of the space requirement of a memory cell having 0.9 micron design rules from 12.2 square microns to 10.2 square microns, i.e., nearly 20% in comparison to conventional contacting techniques as described for example, in the report by Sakamoto et al entitled: "Buried Storage Electrode Cell for Megabit DRAMs", appearing in Technical Digest, IEDM, 1985, pages 710 through 713. The employment of an additional mask is unnecessary. Short circuits to the gate electrode are suppressed by the oxide encapsulation of the gate electrode which is effected by an oxide spacer at the sidewalls of the gate electrode.

The dielectric triple layer beneath the bit line consisting of silicon oxide/silicon nitride/silicon oxide, permits a through hole etching for opening the drain contact which does not appreciably attack the field oxide and the oxide sidewalls of the gate electrodes in the through hole.

In accordance with specific embodiments of the present invention, the bit line is composed of a double layer of an n+ doped polysilicon layer and a layer of tantalum silicide or molybdenum silicide. The polysilicon layer is doped with arsenic, phosphorus, or both. The silicon nitride layer preferably has a thickness of from 10 to 50 nm.

The method of the present invention can be stated as follows:

field oxide regions are generated for lateral insulation of the individual circuit elements by local oxidation. A trench capacitor is then generated in a p-well of a p− doped substrate. The trench is filled with undoped polycrystalline silicon, and a silicon oxide layer is deposited to electrically insulate the trench. A gate oxide is then generated by thermal oxidation. An n-doped polycrystalline layer is deposited over the resulting surface and this is followed by the application of a silicon oxide layer. A double layer of polycrystalline silicon and silicon oxide is applied and structured for gate electrodes of n-channel and p-channel transistors. A further silicon oxide layer is then deposited from the vapor phase whereupon the last named silicon oxide layer is removed except for the sidewalls of the polysilicon structures. Ions are implanted to form source/drain zones of the n-channel and p-channel transistors. A dielectric triple layer of silicon oxide/silicon nitride/silicon oxide is then applied over the surface. Contacts to the diffused drain zone are defined for said switching transistor on the dielectric triple layer. An etching operation is then carried out to open up the contact, the etching being carried out in at least two steps. The first step consists of isotropically etching the silicon oxide layer selectively relative to the silicon nitride layer below it and the other consists of anisotropically etching the silicon nitride layer and the silicon oxide layer lying therebelow to expose the surface of the substrate. A double layer of n-doped polycrystalline silicon and tantalum silicide or molybdenum silicide is used to form a bit line. An intermediate oxide layer is then deposited for insulating the bit line. The subsequent steps of metallization and the like are performed in a conventional manner.

The first etching step is preferably carried out by wet chemical etching and the second etching step is carried out by dry reactive ion etching. Typically, the wet chemical etching is carried out with an etchant containing 7 parts by weight of ammonium fluoride and 1 part hydrofluoric acid for about 60 seconds with a silicon oxide layer of 200 nm thickness. The dry etching may be carried out in a trifluoromethane-oxygen mixture.

The preferred thickness of the silicon nitride layer is in the range from 10 to 50 nm.

The dry etching of the triple layer (oxidelnitridelox-ide) dielectric may take place in three separate phases in the first of which there is an etch in a trifluoromethane plasma, in the second etch a sulfur hexafluoride plasma is employed, and the third etch uses a trifluoromethane-oxygen plasma.

In another preferred form of the invention, the silicon oxide layer which forms the sidewall insulation and the silicon oxide layer which covers the silicon nitride layer are both formed by thermal decomposition of tetraethylorthosilicate. The two silicon oxide layers each has a thickness of about 200 nm.

BRIEF DESCRIPTION OF THE DRAWINGS

The invention will be set forth in greater detail with reference to an exemplary embodiment shown in FIGS. 1 through 12.

FIGS. 1 through 6 illustrate sections through the structure of a four megabit DRAM, utilizing a CMOS process with submicron design rules, a three-dimensional memory cell is produced in a three layer polysilicon technique comprising a self-adjusting direct contact.

FIGS. 11 and 12 show sections through bit line contacts and the layout thereof, FIG. 11 comprising a conventional contact and FIG. 12 showing a self-adjusting contact overlapping with the gate and field oxide regions. Identical parts are used with the same reference numerals in all figures.

DESCRIPTION OF THE PREFERRED EMBODIMENTS

Figure 1:
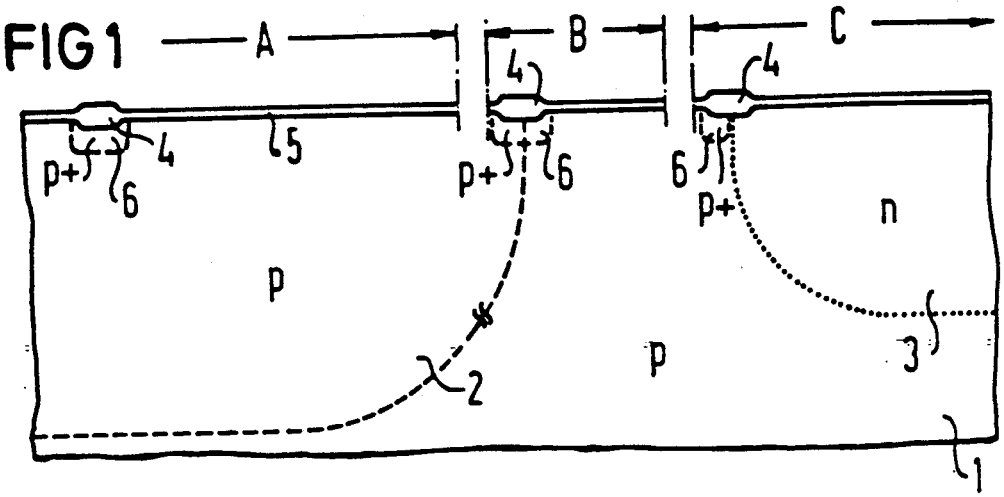

All of the steps of the memory cell manufacture in FIGS. 1 through 6 can also be used for the edge electronics where both conventional as well as overlapping contacts are employed. In the drawings, the sections of the overall arrangement have been identified as the memory cell region A, an intermediate region B, and an edge electronics region C.

In FIG. 1 there is illustrated a p$^-$ doped, single crystal silicon substrate 1 having a resistivity of 50 ohms/cm. P-wells 2 and n-wells 3 together with field oxide regions 4 are generated in a known way such as by using the LOCOS method with a nitride mask. The p-well is a basic p-condition for a high integrating density since it keeps the leakage currents between neighboring trench capacitor cells low. The n-well 3 is required for the p-channel transistors present in the CMOS process. Both wells 2 and 3 are manufactured by correspondingly deep implantations combined with a high temperature drive-in step.

A thermal oxide 4 is produced by field oxidation and is partially lowered into the silicon substrate 1 to provide lateral insulation of the individual circuit elements. Only in those regions which are not protected by the silicon nitride layer of the LOCOS mask is there a field oxide 4 formed. In FIG. 1, the nitride mask has been removed down to the thermal oxide layer 5 lying beneath the nitride. The regions 6 which are doped p$^+$ have arisen by means of field implantation by means of boron.

Figure 2:
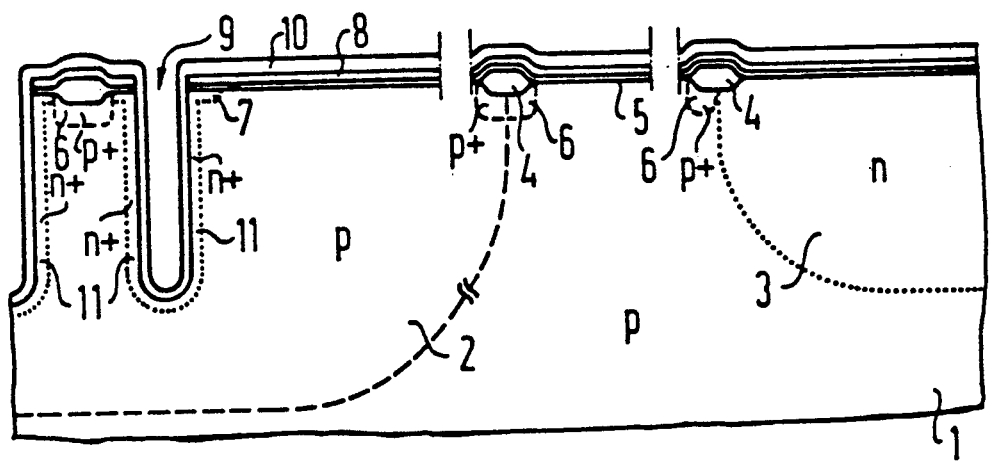

In FIG. 2 there is shown a flat arsenic implantation at reference 7 which is put into the regions of the later formed cell regions A in order to keep capacitance fluctuations in the planar part of the cell capacitor as low as possible with different applied voltages. The remaining regions of the substrate surface are thereby protected against implantation by the photoresist (not shown). Trenches 9 which are about 5 microns deep are then etched into the silicon substrate 1 with an etching mask 8 of silicon oxide and silicon nitride. The etching is carried anisotropically to provide vertical edges. As a result of this expansion into the third dimension, the area of the capacitor electrodes required to provide a reliable memory function can be obtained despite a high integrating density. In order to keep the capacitance stable in the trench 9 as well as in the planar regions, the floor and walls of the trench 9 are doped by outward diffusion of arsenic from a deposited, arsenic containing silicon oxide layer 10. A n$^+$ trench doping 11 thereby arises. The planar region is protected against an undesired doping by means of the etching mask 8.

Figure 3:
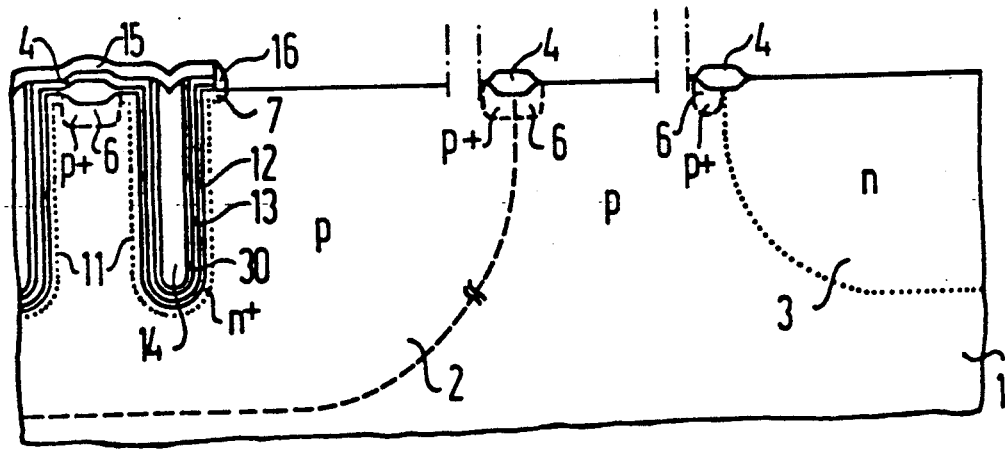

Referring to FIG. 3, after wet chemical etching removal of the arseno-silate glass 10 and after the nitride mask 8 is etched off, the trench 9 is clad with a thin dielectric 12. The electrode 13 referred to as the first polylevel and composed of a phosphorus-doped, polycrystalline silicon is deposited in the trench 9. After application of a silicon oxide layer 30, the trench is filled with polysilicon 14 and is electrically insulated by means of a deposited silicon oxide layer 15. The lateral insulation of the electrode 13 can occur by means of the lateral insulation of the electrode 13 can occur by means of the known spacer technique to be explained later. The sidewall oxide thus produced is referred to at reference 16.

After a thermal oxidation for generating the gate oxide 17 as shown in FIG. 4, a layer of polycrystalline silicon 18 is again deposited, doped with phosphorus, and is covered by a silicon oxide layer 13. The multiple layer 18, 19 is subsequently structured. Both the gates of the n-channel and p-channel transistors as well as conductive connections of the circuit for shorter distances are manufactured in these stages. After a lateral insulation of the polycrystalline silicon structures 18 (constituting the second poly-level) by the known oxide spacer technique (deposition of silicon oxide by thermal decomposition of tetraethylorthosilicate and re-etching so that only the lateral sidewall oxides 20 remain) the n+ ion and p+ implantations 21, 22, and 23 are carried out. Thus, the source/drain zones of the n-channel and p-channel transistors are formed in a known way.

FIG. 5 illustrates the arrangement following the etching of the self-adjusted direct contact 24 for the bit line BL.

In accordance with the present invention, a high density is realized in the cell field A by virtue of the contact 24 between the third polysilicon level (bit line) and the n+ diffusion region 23 which can be produced by the present invention without a large safety spacing between the through hole and the gate 18 as well as between the through hole 24 and field oxide edge 4.

On the basis of a process which will be set forth in greater detail with reference to FIGS. 7 through 10 and which involves the selective etching of a triple layer silicon oxide/silicon nitride/silicon oxide, this contact 24 is self-adjusting and thus meets the demands required with respect to high degrees of integration.

FIG. 6 shows the arrangement comprising the bit line (BL) where, for the purpose of realizing a low-impedance wiring level, the bit line is applied and structured from a combination of arsenic-doped, polycrystalline silicon and tantalum silicide or molybdenum silicide 28.

Flat diffusions are obtained by the arsenic doping without having the lightly doped drain zones of the LDD transistors influenced by the adjacent, self-adjusted bit line contact.

The contact resistance can be further reduced in that a part of the arsenic ions is introduced into the boundary surface between the polycrystalline silicon and the n+ diffused zone 23, being introduced by ion implantation so that the thin, naturally grown oxide is broken at this boundary surface.

A boron-phosphorus-silicate glass is employed for insulation between the bit line BL and the aluminum level (not shown) and is subjected to a flow process for planarization. This step and other method steps for through hole etching, metallization, and passivation of the module occur in a known way and are not further illustrated.

Figure 7:
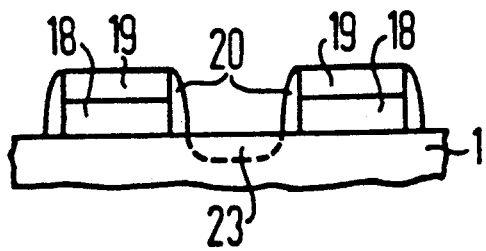
FIGS. 7 through 10 illustrate sections occurring at various times in the method wherein oxide encapsulation of the transfer gate is carried out by an oxide spacer at a double layer of polysilicon/silicon oxide and also illustrate the direct contact etching through a silicon oxide/silicon nitride/silicon oxide dielectric which is essential for the invention for the manufacture of self-adjusted overlapping bit line contacts.

The process steps for the production of a fully overlapping bit line BL contact begin with an oxide encapsulation of the gate. FIG. 7 shows a section constituting a portion of FIG. 4, the right hand side of cell field A, through the region of the silicon substrate 1 on which the gate electrode 18 structured with the silicon oxide layer 19 has been provided with a sidewall oxide 20. The silicon oxide is applied surface wide by thermal decomposition of tetraethylorthosilicate, and the layer is etched back such that the spacer oxide 20 remains only at the structure of the gate edges. The layer thickness at the foot of the spacer is about 200 nm. Since the oxide edge over the polysilicon is rounded in the spacer etching, the thickness of the spacer oxide 20 is slightly less at the level of the upper polysilicon edge than at the foot of the spacer.

Figure 8:
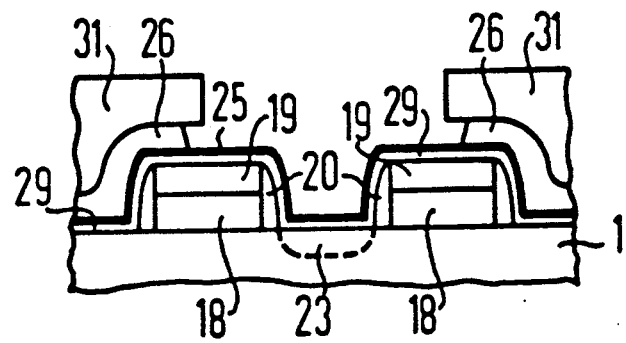

In FIG. 8 there is shown a dielectric between the gate level and the poly-three level with which the bit lines BL of the cell field are structured. The dielectric, in addition to the oxide encapsulation 19, 20 of the gates, consists of the following layers in sequence: an 80 nm silicon oxide layer 29, a 20 nm silicon nitride layer 25, and a 200 nm silicon oxide layer 26. The silicon oxide layers 26 and 29 can be generated by thermal decomposition of tetraethylorthosilicate. This triple layer 25, 26, 29 must be etched through in the direct contact etching step 24 for the Bit Line contact on the diffused zone 23. This etching can occur in the following way.

First, a photoresist mask 31 is formed and the oxide layer 26 is etched by a wet chemical etching process with an etching mixture composed of 7 parts ammonium fluoride and 1 part u hydrofluoric acid. The etching time is about 60 seconds and the etching is very selective with respect to silicon nitride. The silicon nitride layer 25 is thereby not attacked and, on the contrary, serves as an etching stop.

Figure 9:
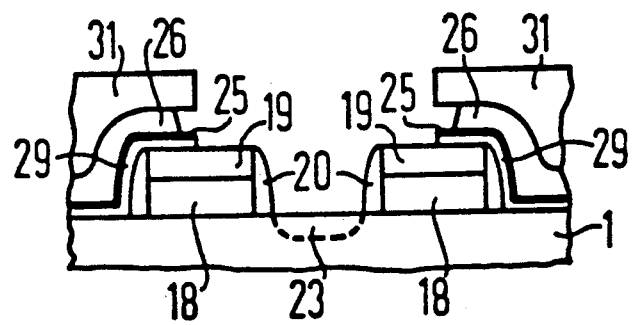

In FIG. 9, there is shown an etching of the double layer silicon nitride/silicon oxide layers on the basis of a dry etching process, the etching occurring dimensionally through to the latter edge 31. The etching may be carried out in a mixture of trifluoromethane and oxygen plasma at 75 parts of the trifluoromethane to 5 parts of the oxygen, using a power of 1350 watts and under a pressure of 50 mT. The etching is carried out for a predetermined time interval. In order to guarantee a good contact resistance of the Bit Line to the diffusion region 23, it is recommended to slightly over-draw the etching (at least by 15 nm of oxide). The oxide insulation 19 of the gate is thereby somewhat thinned. Nevertheless, a remaining oxide thickness 19 on the polysilicon gate 18 of greater than 100 nm in all locations can be obtained. As a result of the good selectivity of etching between oxide and the silicon (a ratio of 20 to 1) there is no risk of incipient substrate etching. In the through hole, the field oxide is thinned by at most 50 nm and the diode properties are therefore not influenced. As may be seen from FIG. 9, a through hole having slanting walls is generated by the wet etching.

Figure 10:
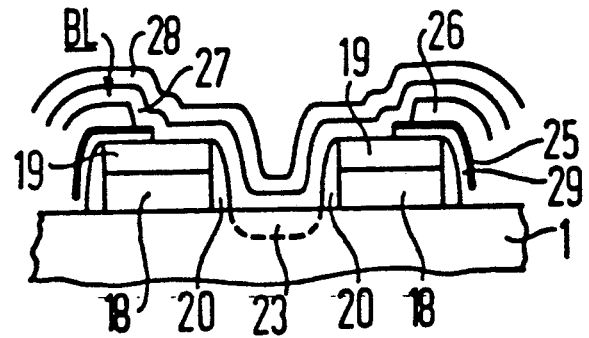

FIG. 10 shows the arrangement after the application of the bit line composed of arsenic-implanted polysilicon 27 and sputtered tantalum silicide or molybdenum silicide 28. The contact region of the polysilicon layer 27 to the diffusion zone 23 is defined by the edges of the field oxide (not shown) and by the oxide spacer 20 at the gate. The spacing between the contact and the gate amounts to only about 200 nm.

FIG. 11 shows a Bit Line contact manufactured in accordance with a conventional method. In the conventional design of a transistor, the design distances of the contact hole on source/drain to gate ($d_{KG}$) or to the field oxide ($d_{KL}$) depend on the adjustment precision of the corresponding photo techniques relative to one another and the dimensional accuracy of the structure transfer. The word line of polycrystalline silicon is referred to at WL and the bit line of the double layer polycrystalline silicon/metal silicide is referred to as BL. The legend "LOCOS" refers to the field oxide edge, and the shaded region comprises the contact.

FIG. 12 illustrates the technology which enables the overlap of the source/drain contact over the gate and field oxide (LOCOS) with reliable insulation in the manner of the present invention. The distances $d_{KG}$ and $d_{KL}$ become independent of the photo technique. The contacts thus become self-adjusting. These enable a significant increase in the integration density of the components as may be observed in FIG. 12. The distance $k_{KG}$ of the of the contact to the contact to the gate amounts to 0.2 micron in spacer width. The distance $d_{KL}$ of the contact to the field oxide region (LOCOS) amounts to zero micron.

The electrical parameters of insulation of word-to bit line, bit line to substrate, transistor properties, degradation, leakage currents of the component, and the like are not influenced in an unfavorable way by the space saving bit line contact of the present invention.

It will be evident that various modifications can be made to the described embodiments without departing from the scope of the present invention.

We claim as our invention:

1. A semiconductor device comprising:
   a doped semiconductor substrate;
   a switching field effect transistor having an insulated gate electrode at the surface of said substrate and source and drain zones in said substrate;
   a first insulating layer covering said insulated gate electrode at the surface of said substrate;
   a trench capacitor formed in a trench in said substrate under said field effect transistor and electrically connected to a source or drain zone thereof;
   a bit line spaced above the level of the insulated gate electrode by both an intermediate insulating layer and said first insulating layer, said intermediate insulating layer comprising a triple layer of silicon oxide/silicon nitride/silicon oxide, whereby the silicon nitride layer is significantly thinner than the silicon oxide layer lying thereon but is at least 10 nm thick, the layer adjacent to said bit line being a silicon oxide layer, a bit line contacting recess formed in said intermediate insulating layer for the electrical connection of said bit line to said drain zone, said bit line overlapping said insulated gate electrode, said bit lien also overlapping a neighboring field oxide region.

2. The semiconductor device of claim 1, wherein said insulated gate electrode comprises polysilicon and is encapsulated by said first insulating layer on all sides; and wherein said first insulating layer has a thickness at lateral side walls of said insulated gate of about 200 nm.

3. The semiconductor device of claim 1, wherein said switching field effect transistor is an n-channel MOS field effect transistor, wherein said tranch capacitor comprises n+-doped sidewalls and said intermediate insulating layer is disposed over a p-well in the semiconductor substrate, and the tranch is filled with undoped polysilicon.

4. A semiconductor device comprising:
   a semiconductor substrate;
   a switching field effect transistor having an insulated gate electrode at the surface of said substrate and source and drain zones in said substrate;
   a first insulating layer covering said insulated gate electrode at said surface of said substrate;
   a tranch capacitor formed in a trench in said substrate under said field effect transistor and electrically connected to a source or drain zone thereof, said tranch capacitor having a depth of up to about 4 $\mu$m and a cross-section of about 0.8 to about 1.0 $\mu$m$^2$; and
   a bit line spaced above the level of the insulated gate electrode by both an intermediate insulating layer and said first insulating layer, said intermediate insulating layer comprising at least one double layer of silicon oxide and silicon nitride, the layer adjacent to said bit line being a silicon oxide layer, a bit line contacting recess formed in said intermediate insulating layer for the electrical connection of said bit line to said drain zone, said bit line overlapping said gate electrode, said bit line also overlapping a neighboring field oxide region.

5. A semiconductor device comprising:
   a doped semiconductor substrate;
   a switching field effect transistor having an insulated gate electrode at the surface of said substrate and source and drain zones in said substrate;
   a first insulating layer covering said insulated gate electrode at said surface of said substrate;
   a trench capacitor formed in a trench in said substrate under said field effect transistor and electrically connected to a source or drain zone thereof;
   a bit line spaced above the level of the insulated gate electrode by both an intermediate insulating layer and said first insulating layer, said intermediate insulating layer comprising at least one double layer of silicon oxide and silicon nitride, the layer adjacent to said bit line being a silicon oxide layer, said bit line comprising a double layer of n+-doped polysilicon and a silicide of a refractory metal, a bit line contacting recess formed in said intermediate insulating layer for the electrical connection of said bit line to said drain zone, said bit line overlapping said insulated gate electrode, said bit line also overlapping a neighboring field oxide region.

6. The semiconductor device of claim 5, wherein said refractory metal comprises tantalum.

7. The semiconductor device of claim 5, wherein said refractory metal comprises molybdenum.

8. The semiconductor device of claim 5, wherein said polysilicon layer is doped with arsenic and/or phosphorus.

9. A semiconductor device comprising:
   a doped semiconductor substrate;
   a switching field effect transistor having an insulated gate electrode at the surface of said substrate and drain and source zones in said substrate;
   a first insulating layer covering said insulated gate electrode at said surface of said substrate;
   a trench capacitor formed in a trench in said substrate under said field effect transistor and electrically connected to a source or drain zone thereof;
   a bit line spaced above the level of said insulated gate electrode by both an intermediate insulating layer and said first insulating layer, said intermediate insulating layer comprising at least one double layer of silicon oxide and silicon nitride, said silicon nitride layer having a thickness from about 10 to about 15 nm, the layer adjacent to said bit line being a silicon oxide layer, a bit line contacting recess formed in said intermediate insulating layer for the electrical connection of said bit line to said drain zone, said bit line overlapping said insulated gate electrode, said bit line also overlapping a neighboring field oxide region.

10. A three-dimensional, one transistor cell arrangement for dynamic semiconductor memories, comprising:
    a doped semiconductor substrate;

a switching field effect transistor having an insulated gate electrode at the surface of said substrate and source and drain zones in said substrate;

a trench capacitor formed in a trench in said substrate under said field effect transistor and electrically connected to one of the source and drain zones thereof;

a bit line being spaced above the level of the gate electrode by an intermediate insulating layer, said insulating layer being a triple layer composed of silicon oxide/silicon nitride/silicon oxide, the layer adjacent to said bit line being a silicon oxide layer, said silicon nitride layer being significantly thinner than the layer of silicon oxide lying above it but having a thickness of from 10 to about 50 nm.

* * * * *